United States Patent
Nakanishi

(10) Patent No.: US 7,065,608 B2
(45) Date of Patent: Jun. 20, 2006

(54) APPARATUS FOR RECORDING DATA AND METHOD FOR WRITING DATA TO FLASH MEMORY

(75) Inventor: Kenichi Nakanishi, Tokyo (JP)

(73) Assignee: Sony Corporation (JP)

( * ) Notice: Subject to any disclaimer, the term of this patent is extended or adjusted under 35 U.S.C. 154(b) by 157 days.

(21) Appl. No.: 10/204,776

(22) PCT Filed: Dec. 28, 2001

(86) PCT No.: PCT/JP01/11678

§ 371 (c)(1),
(2), (4) Date: Aug. 22, 2002

(87) PCT Pub. No.: WO02/054247

PCT Pub. Date: Jul. 11, 2002

(65) Prior Publication Data

US 2003/0014582 A1    Jan. 16, 2003

(30) Foreign Application Priority Data

Dec. 28, 2000   (JP) .............................. 2000-403461

(51) Int. Cl.
*G06F 12/00* (2006.01)
(52) U.S. Cl. .......................... 711/103; 711/5
(58) Field of Classification Search ............ 711/5, 711/157, 209, 103, 154, 156
See application file for complete search history.

(56) References Cited

U.S. PATENT DOCUMENTS

| | | | |
|---|---|---|---|
| 5,761,732 A * | 6/1998 | Shaberman et al. | 711/157 |
| 6,000,006 A * | 12/1999 | Bruce et al. | 711/103 |
| 6,026,465 A * | 2/2000 | Mills et al. | 711/103 |
| 6,148,354 A * | 11/2000 | Ban et al. | 710/301 |
| 6,388,908 B1 * | 5/2002 | Araki et al. | 365/45 |
| 6,397,314 B1 * | 5/2002 | Estakhri et al. | 711/168 |
| 6,687,784 B1 * | 2/2004 | Douniwa et al. | 711/103 |
| 2002/0110014 A1 * | 8/2002 | Araki et al. | 365/45 |

FOREIGN PATENT DOCUMENTS

| | | |
|---|---|---|
| JP | 11-144478 A1 | 5/1999 |
| JP | 11-249968 A1 | 9/1999 |

\* cited by examiner

*Primary Examiner*—Nasser Moazzami
(74) *Attorney, Agent, or Firm*—Lerner, David, Littenberg, Krumholz & Mentlik, LLP

(57) ABSTRACT

The present invention provides an apparatus for recording data, including a storage unit (4) for reading out management information stored in the flash memory (2) to store read out management information, an updating unit (7) for updating management information stored in the storage unit (4), a management information writing unit (3) for writing management information updated by the updating unit (7) to the page being a unit in writing data to the flash memory (2), and a control unit (7) for controlling the management information writing unit (3) so that, when the management information writing unit (3) writes updated management information to a page of the flash memory (2), a block which is different from a block including a page in which management information just before updating is written is selected, and updated management information is written to a vacant page of thus selected block.

10 Claims, 7 Drawing Sheets

APPARATUS FOR RECORDING DATA AND METHOD FOR WRITING DATA TO FLASH MEMORY

TECHNICAL FIELD

The present invention relates to management information written in a flash memory, and in particular, to an apparatus for recording data and a method for writing data to a flash memory which protect the management information from a writing error raised when updating the management information.

BACKGROUND ART

As an auxiliary storage medium replacing an HDD (Hard Disc Drive) of a portable PC (Personal Computer), a flash memory being a nonvolatile PROM (Programmable Read-Only Memory) to which data can be electrically written many times and data stored therein can be electrically deleted at a time has been used, since it is small and light, and enables high speed processing and low power consumption.

There is also used a memory card which is a removable flash memory. The memory card is installed to a data recording apparatus for recording data, to which picture data and music data is recorded.

Picture data and music data recorded in the memory card can be reproduced by means of a PC, a digital camera, or a music playback apparatus, etc.

Next, the configuration of the flash memory will be explained with reference to FIG. 1. The flash memory is composed of a plurality of blocks, each having data of a predetermined amount and being a unit in deleting data. Also, each block is composed of a plurality of pages, each having data of a predetermined amount and being a unit in writing and reading out data. Each page has a data area of e.g. 512 Bytes to which data is to be written, and an extra area of e.g. 16 Bytes to which parity data, etc. is to be written.

The flash memory has important information such as information for initiating the data recording apparatus, information for managing the data recording apparatus, etc., which will be referred to as management information, stored in the data area thereof, besides picture data and music data recorded by the data recording apparatus.

The management information is read out and stored to a RAM (Random Access Memory) of the data recording apparatus, and is managed, when using the flash memory. Stored management information is updated under the control of a CPU of the data recording apparatus, if necessary, in accordance with change of stored data when picture data and music data is written, and updated management information is rewritten to the data area of the flash memory.

Next, the operation of updating management information stored in a flash memory will be explained with reference to FIG. 2. It is assumed that the management information is written in a predetermined block of a flash memory.

Firstly, in step S21, a CPU retrieves a predetermined block of the flash memory to determine whether there is a vacant page in the block or not. Then, in case there is a vacant page, the process proceeds to step S22, while in case there is no vacant page, the process proceeds to step S23.

In step S22, the CPU reserves the vacant page in the block, in which also management information just before updating is written, as a new page for writing the updated management information. In case the page in which the management information just before updating is written is the last page of the block, the updated management information is written to the leading page of the next block.

In step S23, since there is no vacant page in all blocks of the flash memory, the CPU deletes all the management information before updating written in the leading block so as to prepare a block for writing the updated management information. Then, the CPU reserves the leading page of the block whose management information before updating is deleted as a new page for writing the updated management information.

In step S24, the CPU writes the updated management information to the new page reserved in step S22 or step S23. When step S24 ends, the processing of updating the management information is terminated.

When updating the management information under the steps shown in the flow chart of FIG. 2, the management information in the block of the flash memory is updated as shown in FIG. 3.

When blocks to which the management information is written are 100a and 100b, firstly, the management information is written to the block 100a from a page number 0 to a page number n. Then, the management information is written to the block 100b from a page number 0. Thus, in the block of the flash memory, the management information is updated for each block sequentially.

When updating the management information of the flash memory, in case updating processing is unsuccessfully performed, the CPU updates the management information again using the management information just before updating.

In writing data to a page of the flash memory, when there is raised an error, the error affects all data in a block to which the page belongs.

That is, as shown in FIG. 4, when there is raised an error in a bit of a page of a block, there are also raised errors in similar bits of all the other pages of the block, which damages all data in the block.

In updating the management information of the flash memory shown in the flow chart, since the management information is written to a vacant page which is next to a page of the block in which the management information before updating is written, when there is raised an error due to unsuccessful updating processing, all the management information in the block including the page with the error is damaged. Thus, the management information just before updating, which is necessary in case updating processing is unsuccessfully performed, is also damaged. So, the CPU cannot update the management information again since the management information just before updating cannot be used.

Furthermore, each of memory cells of a conventional flash memory can store information of only 1 bit, while, so as to cut costs and enlarge the capacity, there is also used a flash memory each of whose memory cells can store information of 2 bits and 4 bits. In this case, area of damaged data spreads over a wide range of bits, which cannot be coped with by error correction codes.

DISCLOSURE OF THE INVENTION

Accordingly, the present invention has an object to overcome the above-mentioned drawbacks of the prior art by providing an apparatus for recording data and a method for writing data to a flash memory which protect management information from a writing error raised when updating the management information.

The above object can be attained by providing an apparatus for recording data which writes data to a flash memory, the flash memory having data written therein in a unit of a page having data of a predetermined amount, which written data can be deleted at a time in a unit of a block composed of a plurality of pages, including:

storage means for reading out management information stored in the flash memory to store read out management information;

updating means for updating management information stored in the storage means;

management information writing means for writing management information updated by the updating means to the page being a unit in writing data to the flash memory; and control means for controlling the management information writing means so that, when the management information writing means writes updated management information to a page of the flash memory, a block which is different from a block including a page in which management information just before updating is written is selected, and updated management information is written to a vacant page of thus selected block.

According to the apparatus for recording data of the present invention, management information just before updating, which is necessary in updating management information can be surely protected.

Also, the above object can be attained by providing a method for writing data to a flash memory, the flash memory having data written therein in a unit of a page having data of a predetermined amount, which written data can be deleted at a time in a unit of a block composed of a plurality of pages, including the steps of:

reading out management information stored in the flash memory;

having read out management information stored to a predetermined storage means;

updating management information stored in the storage means;

when writing updated management information to a page of the flash memory, selecting a block which is different from a block including a page in which management information just before updating is written; and writing updated management information to a vacant page of thus selected block.

According to the method for writing data to a flash memory of the present invention, management information just before updating, which is necessary in updating management information can be surely protected.

BEST MODE FOR CARRYING OUT THE INVENTION

The apparatus for recording data and the method for writing data to a flash memory of the present invention will further be described below concerning the best modes with reference to the accompanying drawings.

Figure 1:
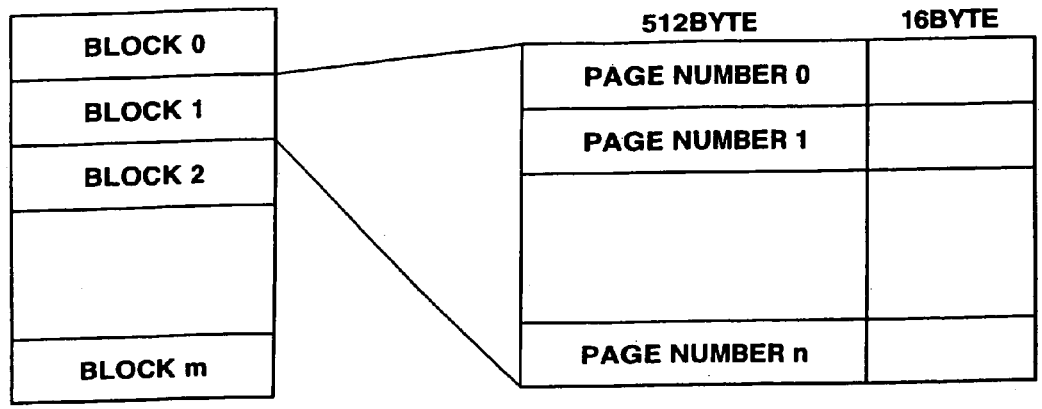
FIG. 1 shows the configuration of a flash memory.
Figure 2:
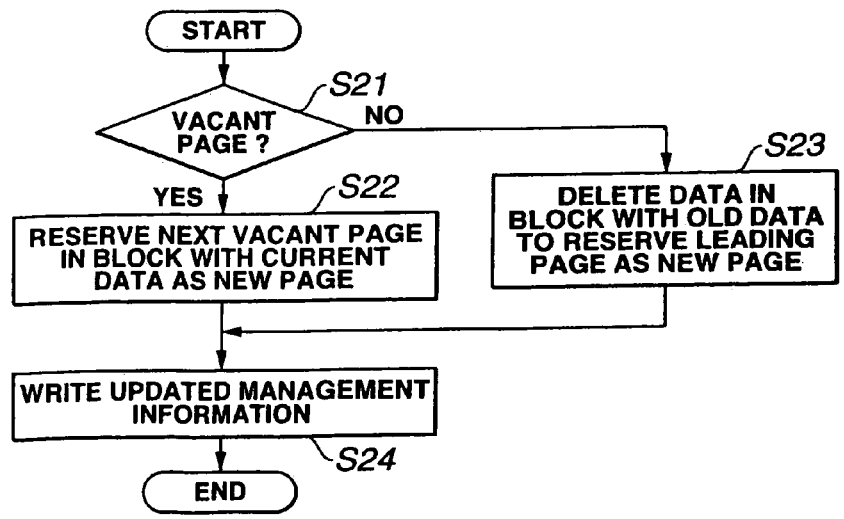
FIG. 2 shows a flow chart of the conventional operation of updating management information stored in the flash memory of a data recording apparatus.
Figure 3:
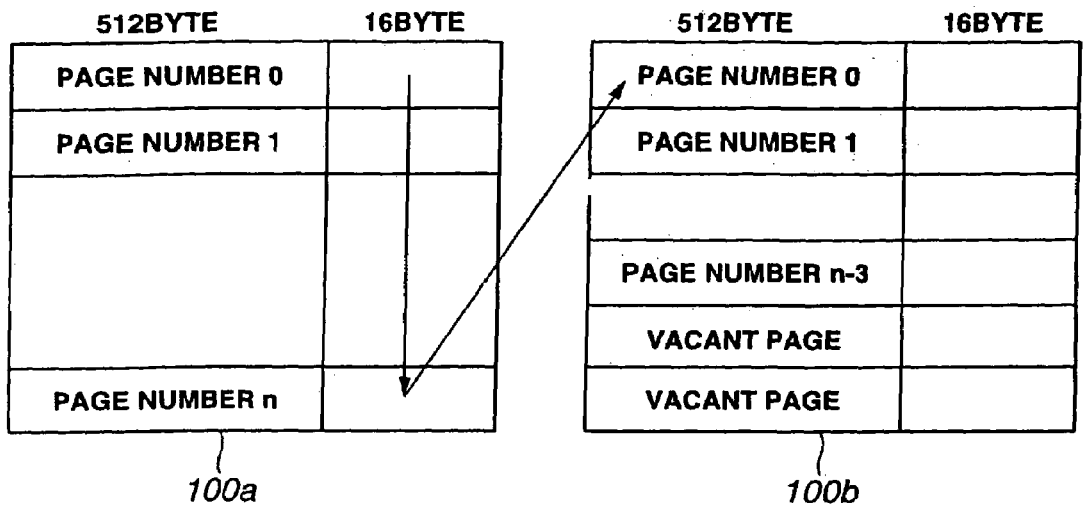
FIG. 3 shows the configuration of a block of the flash memory of the data recording apparatus to which management information is to be written.
Figure 4:
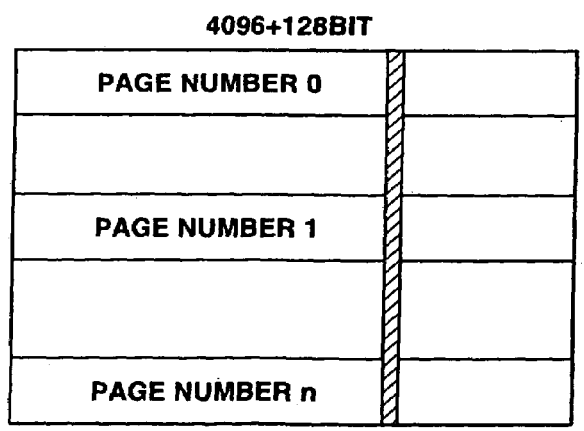
FIG. 4 shows an error which affects all data in the block, which is raised in writing data to a page of the flash memory of the data recording apparatus.
Figure 5:
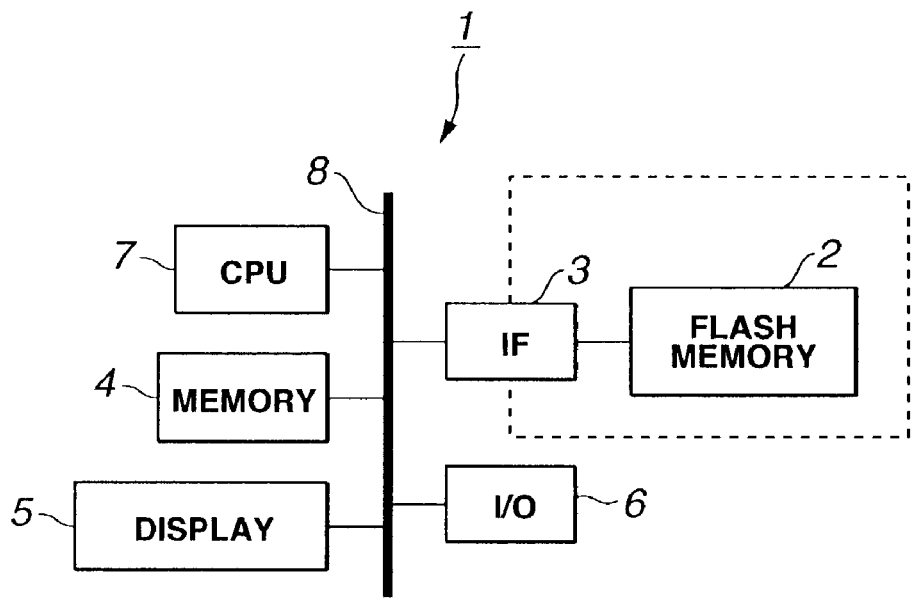
FIG. 5 shows a block diagram of a data recording apparatus according to the present invention.

The present invention is applicable to a data recording apparatus 1 for recording data shown in FIG. 5.

The data recording apparatus 1 includes a flash memory 2, an interface (IF) 3, a memory 4, a display 5, an I/O (Input/Output) 6, a CPU (Central Processing Unit) 7, and a bus 8.

The flash memory 2 is a nonvolatile PROM (Programmable Read-Only Memory) to which data can be electrically written many times and data stored therein can be electrically deleted at a time. The data recording apparatus 1 writes picture data and music data to the flash memory 2 in accordance with instructions of the user.

The flash memory 2 may be fixed to the data recording apparatus 1, or may be removable from the data recording apparatus 1.

The interface 3 connects the flash memory 2 to the bus 8, which reads out data stored in the flash memory 2 as well as writes data to the flash memory 2.

The memory 4 is a RAM (Random Access Memory) to/from which data can be written/read out, which is the main memory of the data recording apparatus 1. The memory 4 stores management information read out from the flash memory 2 under the control of the CPU 7.

The display 5 displays programs used in writing data to the flash memory 2, free space of the flash memory 2, etc.

The I/O 6 is an input/output interface which receives instructions to the data recording apparatus 1 from the user, and outputs picture data and music data stored in the flash memory 2.

The CPU 7 controls respective units of the data recording apparatus 1 wholly. Also, the CPU 7 reads out the management information stored in the flash memory 2 to make the memory 4 store the read out management information thereto, and updates and manages the management information stored in the memory 4.

Also, the CPU 7 controls the operation of writing picture data and music data to the flash memory 2 based on the management information stored in the memory 4.

The bus 8 connects above described respective units, which consists of a control bus for sending control signals from the CPU 7 to the respective units and a data bus for sending various data to the respective units.

Next, the operation of updating the management information stored in the flash memory 2 will be explained with reference to a flow chart of FIG. 6.

Firstly, in step S1, when the operation of updating the management information is started, the CPU 7 retrieves the inside of the flash memory 2 to obtain a new page for writing updated management information.

In step S2, the CPU 7 writes the updated management information to the new page of the flash memory 2 obtained in step S1.

In step S3, the CPU 7 determines whether there is an error in the written management information or not. In case there is no error, the processing of updating the management information is terminated, while, in case there is an error, the process proceeds to step S4.

In step S4, the CPU 7 retrieves the inside of the flash memory 2 to obtain a new block which is different from the block including the page in which the management information is written in step S2. When step S4 ends, the process returns to step S1, and this processing is continued until the updated management information is written without an error.

Thus, when writing the updated management information, the data recording apparatus 1 reserves a page of a new block which is different from the block including the page in which the management information just before updating is written. So, even though a writing error is raised when updating the management information, the management information just before updating can be surely protected.

Next, specific operations of the step S1 and step S2 shown in the above described flow chart of FIG. 6 will be explained with reference to a flow chart of FIG. 7.

Before explaining the operations of the step S1 and step S2 using a flow chart of FIG. 7, the block configuration of the flash memory 2 will be explained with reference to FIG. 8.

The flash memory 2 is composed of a plurality of blocks, each of whose block size is 16 KB (kilobytes). A group of 512 blocks is defined as a segment, and logical addresses and preliminary blocks are managed every segment.

That is, for example, the flash memory 2 is composed of a segment number 0 and a segment number 1 in case the memory size thereof is 16 MB (megabytes), while being composed of from a segment number 0 to a segment number 3 in case the memory size thereof is 32 MB. Similarly, the flash memory 2 is composed of from a segment number 0 to a segment number 7 in case the memory size thereof is 64 MB, and is composed of from a segment number 0 to a segment number 15 in case the memory size thereof is 128 MB, as shown in FIG. 8.

Also, by thus using the segment, the range of physical block numbers corresponding to which the logical addresses are set up is determined.

Figure 8:
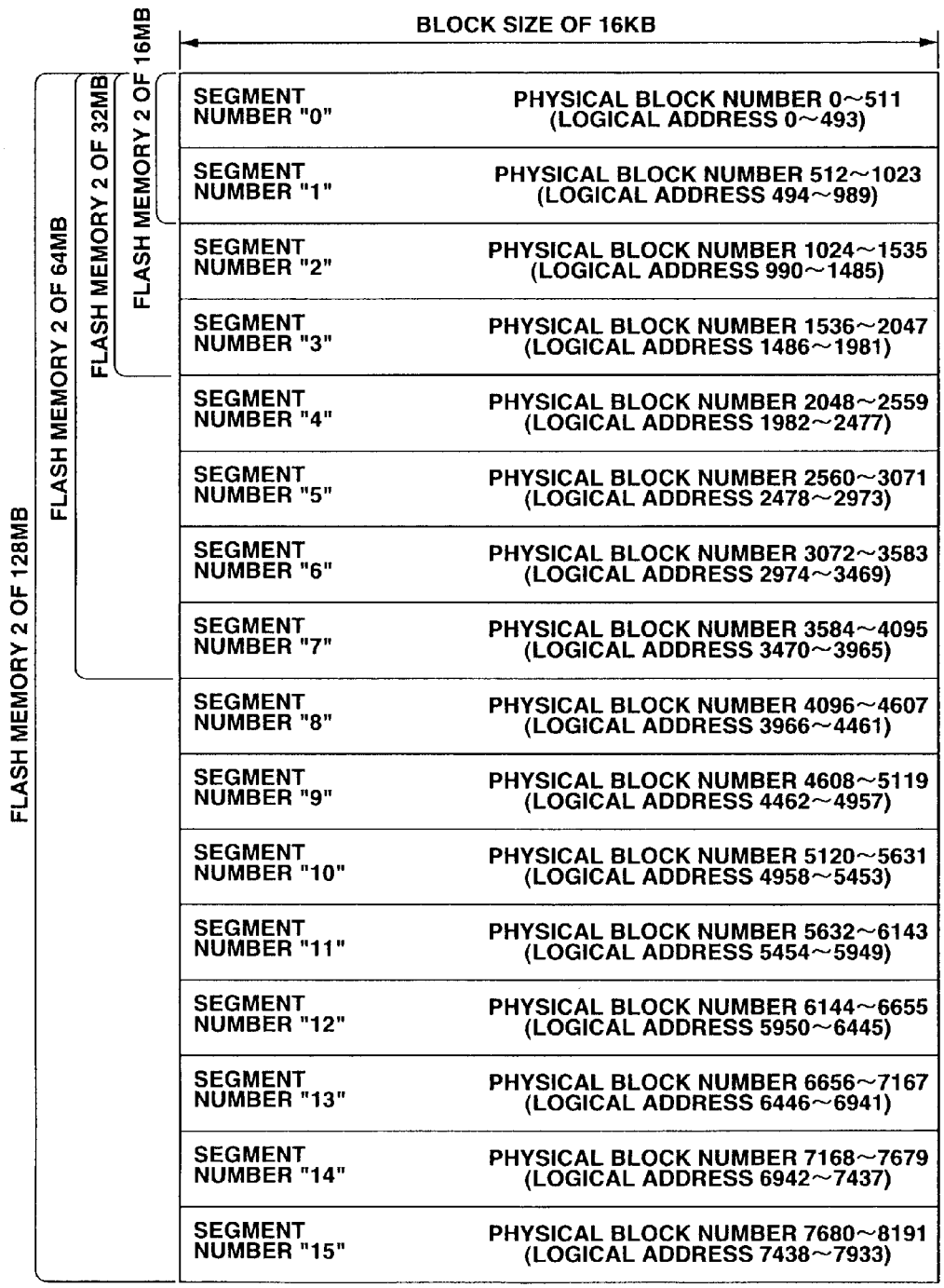
FIG. 8 shows the specific configuration of a block of the flash memory of the data recording apparatus.

For example, as shown in FIG. 8, a segment which is composed of from a physical block number 0 to a physical block number 511 (the number or sum of the blocks is 512) is defined as a segment number 0. It is determined in advance that logical addresses set up in the segment number 0 are from 0 to 493, as shown in parentheses, and the rest of the blocks are managed as the preliminary blocks.

Similarly, as for the respective segments defined as the segment number 0 to the segment number 15, logical addresses corresponding to physical block numbers are set up, and blocks which do not correspond to logical addresses are managed as the preliminary blocks.

It is desired that the preliminary blocks be blocks for writing management information. This is because there is no access by real data to the preliminary blocks, and the preliminary blocks are not caused to correspond to logical addresses and physical block numbers. That is, the preliminary blocks can be managed independently as management data area, and corresponding operation can be performed easily even though complicated updating processing which spreads over even blocks and odd blocks is performed. As the management information, there are conversion table data of logical/physical, directory entry of real data, etc.

In the following explanation, it is assumed that two blocks for writing the updated management information are prepared, which are referred to as an even block and an odd block, respectively.

Figure 9:
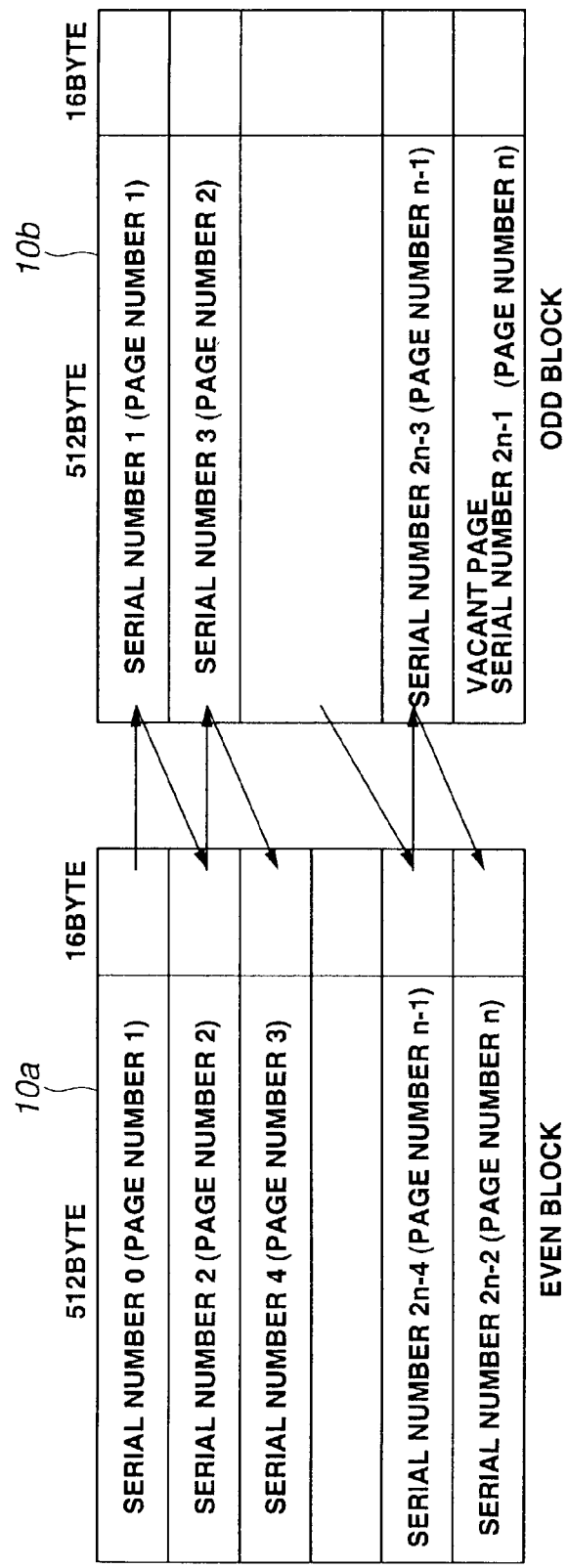
FIG. 9 shows the configuration of an even block and an odd block of the flash memory of the data recording apparatus to which management information is to be written.

Also, serial numbers beginning from 0 are given to pages of the even block and the odd block. The updated management information is stored in the flash memory 2 in order of the serial numbers. For example, serial numbers of 0, 2, 4, 6, . . . are given to an even block 10a, while serial numbers of 1, 3, 5, 7, . . . being given to an odd block 10b, as shown in FIG. 9. The updated management information is written to the pages of the blocks in order of the serial numbers of 0, 1, 2, 3, 4, 5, 6, 7, . . . .

Each page of the even block 10a and the odd block 10b has a page number given thereto, respectively. As for correspondence between the page numbers and the serial numbers, the page number for the serial number 0 and 1 is 1, while the page number for the serial number 2 and 3 being 2.

The page numbers are given to the respective pages of the even block 10a and the odd block 10b for the convenience of explanation. Thus, when writing the management information in actual processing, the CPU 7 does not designate the serial number directly, but instructs the flash memory 2 to write desired management information to the N-th page from a predetermined reference page of the blocks.

Firstly, in step S11, when the operation of updating management information is started, the CPU 7 retrieves a page of the flash memory 2 in which the management information just before updating is written. In case the management information just before updating is written in a page of the odd block 10b, the process proceeds to step S12. On the other hand, in case the management information just before updating is not written in a page of the odd block 10b, but written in a page of the even block 10a, the process proceeds to step S15.

The updated management information is written to a page whose serial number comes after that of a page in which the management information just before updating is written.

In step S12, since the management information just before updating is written in a page of the odd block 10b, the updated management information is to be written to a page of the even block 10a. Thus, the CPU 7 reserves a page of the even block 10a, whose page number is larger by one than that of the page of the odd block 10b in which the management information just before updating is written, as a page for writing the updated management information.

In step S13, the CPU 7 determines whether there is a vacant page in the even block 10a or not. Then, in case there is no vacant page, the process proceeds to step S14, while in case there is a vacant page, the process proceeds to step S18.

This is, the steps are for determining whether the page of the odd block 10b in which the management information just before updating is written is the last page of the odd block 10b or not. That is, in case the management information just before updating is written in the last page of the odd block 10b, the page of the even block 10a whose page number is larger by one than that of the last page of the odd block 10b cannot be found in step S12. Thus, the state in which there is no page for writing the updated management information is prevented from occurring by determining whether there is a vacant page in step S13.

In step S14, since there is no vacant page in the even block 10a, the CPU 7 deletes old management information written in the even block ba, and reserves the leading page thereof whose page number is 1 and serial number is 0 as a page for writing the updated management information. When step S14 ends, the process proceeds to step S18.

In step S15, the CPU 7 determines whether the page in which the management information just before updating is the leading page of the even block 10a, that is, the page number is 1 and the serial number is 0, or not. In case the page in which the management information just before updating is written in the leading page of the even block 10a, the process proceeds to step S16, while in case not, the process proceeds to step S17.

In step S16, since the management information just before updating is written in the leading page of the even block 10a whose page number is 1 and serial number is 0, the CPU 7 deletes all information written in the odd block lob, and reserves the leading page thereof whose page number is 1 and serial number is 1 as a page for writing the updated management information.

In step S17, since the management information just before updating is written in a page other than the leading page of the even block 10a whose page number is 1 and serial number is 0, the CPU 7 reserves a page of the odd block lob, whose page number is equal to that of the page of the even block 10a in which the management information just before updating is written, as a page for writing the updated management information.

In step S18, the CPU 7 controls the interface 3 so that the updated management information is written to the reserved page.

Thus, since the data recording apparatus 1 secures a page of a block of the flash memory 2 for writing the updated management information, which block is different from a block including a page in which management information just before updating is written, the management information just before updating, which is necessary in case updating processing is unsuccessfully performed and a writing error is raised, can be surely protected.

As has been described above, the memory 4 and the CPU 7 of the data recording apparatus 1 updates and manages management information of the flash memory 2. On the other hand, according to the present invention, the management information may be updated and managed using a control IC which controls writing of data to a flash memory, in which case the flash memory and the control IC form a removable media. For example, there may be employed a memory card as such a removable media for updating and managing management information, which includes a flash memory and a control IC.

Figure 10:
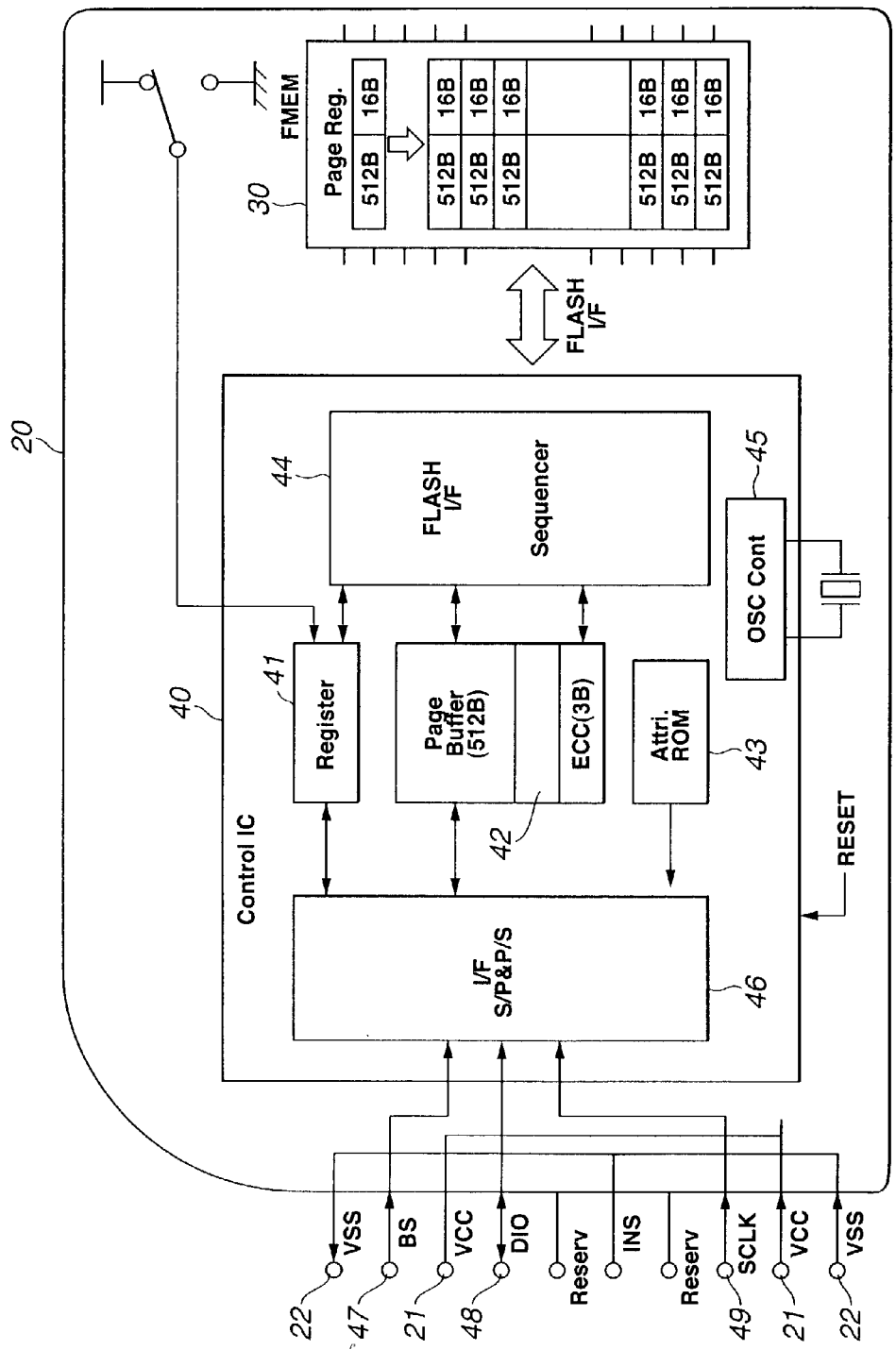
FIG. 10 shows a block diagram of a memory card according to the present invention.

Next, the configuration of a memory card 20 which includes a flash memory and a control IC will be explained with reference to FIG. 10.

The memory card 20 includes a flash memory 30, a control IC 40. The memory card 20 has a VCC 21 being a terminal for power supply, and a VSS 22 being a terminal for ground. Thus, when connected to a data recording apparatus, power is supplied to the memory card 20.

The configuration of the flash memory 30 is similar to that of the above-described flash memory 2. That is, the flash memory 30 is composed of a plurality of blocks, each having data of a predetermined amount and being a unit in deleting data. Also, each block is composed of a plurality of pages, each having data of a predetermined amount and being a unit in writing and reading out data. Each page has a data area of e.g. 512 Bytes to which data is to be written, and an extra area of e.g. 16 Bytes to which parity data, etc. is to be written.

The control IC 40 includes a register 41, a page buffer 42, an attribute ROM 43, a flash memory I/F 44, an OSC controller 45, and an IF 46.

The register 41 is a parameter register for storing parameters of data read out from the flash memory 30, such as the above-described serial numbers, to read out corresponding data from the flash memory 30 in accordance with commands, and for sending read out data to the page buffer 42.

The page buffer 42 temporarily stores data read out in accordance with the parameters stored in the register 41. The register 41 works as the memory 4 of the above-described data recording apparatus 1.

The attribute ROM 43 is a read-only memory which stores memory information of the memory card 20.

The flash memory I/F 44 is an interface which connects the control IC 40 to the flash memory 30, and writes data to the flash memory 30 and reads out data from the flash memory 30 in accordance with commands sent from the register 41.

The OSC controller 45 generates clocks of the control IC 40 to control operation timing of the control IC 40.

The IF 46 is an interface which connects the control IC 40 to the data recording apparatus, and the control IC 40 receives control signals from the data recording apparatus, to which the memory card 20 is installed, and receives/sends data from/to the data recording apparatus via the IF 46.

The IF 46 includes a BS (bus state) 47, a DIO (DATE 1/0) 48, and an SCLK (Serial Clock) 49.

The BS 47 transmits control signals sent from the CPU 7 which controls input/output operation of data to/from the memory card 20.

The DIO 48 transmits data sent from the data recording apparatus to the flash memory 30 and data sent from the flash memory 30 to the data recording apparatus.

The SCLK 49 transmits clocks which control the control IC 40.

Figure 6:
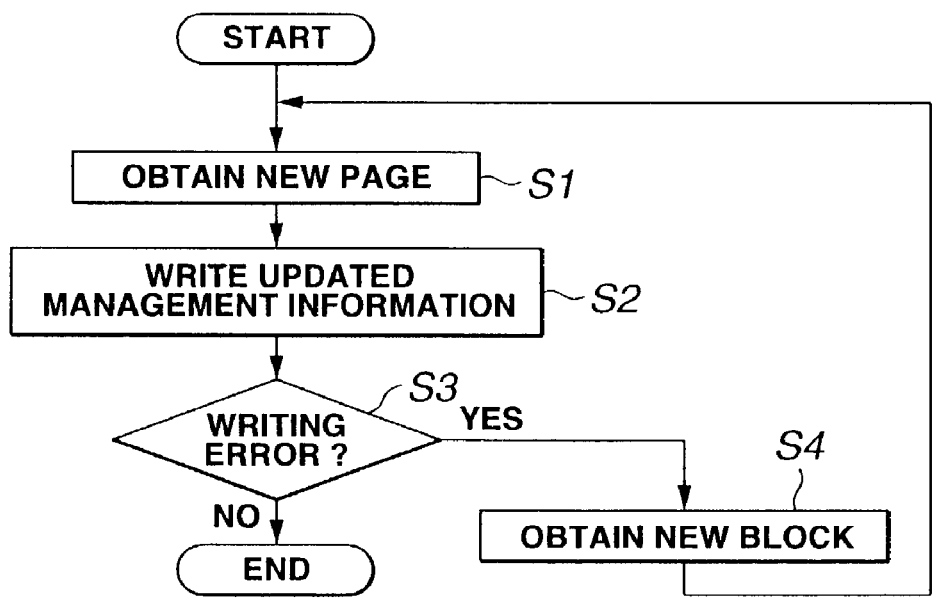
FIG. 6 shows a flow chart of the operation of updating management information stored in a flash memory of the data recording apparatus.
Figure 7:
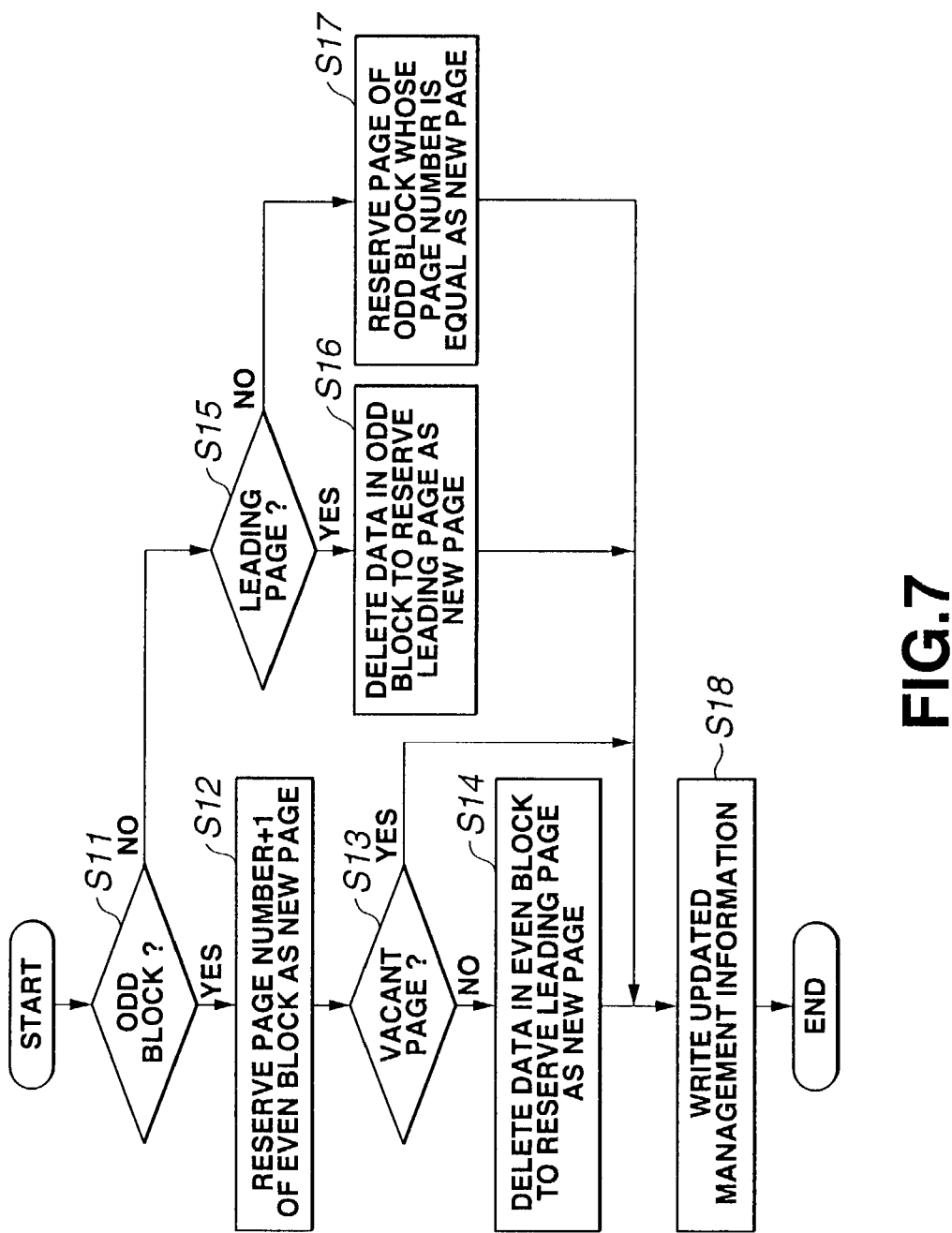
FIG. 7 shows a flow chart of the specific operation of updating management information stored in a flash memory of the data recording apparatus.

Thus, including the flash memory 30 and the control IC 40, the memory card 20 can perform operations shown in the flow charts of FIG. 6 and FIG. 7 when updating management information.

So, even though a writing error is raised at the flash memory 30 of the memory card 20 when updating management information, management information just before updating, which is necessary in updating the management information, can be surely protected.

INDUSTRIAL APPLICABILITY

As in the above, according to the apparatus for recording data of the present invention, in updating management information stored in a flash memory, a control unit controls a management information writing unit so that a block which is different from a block including a page in which management information just before updating is written is selected, and updated management information is written to a vacant page of thus selected block. Thus, management information just before updating can be protected from damage of all management information in a block due to a writing error raised when updating management information. So, even though a writing error is raised, management information can be updated using protected management information just before updating.

Furthermore, according to the method for writing data to a flash memory of the present invention, in updating management information stored in a flash memory, a block which is different from a block including a page in which management information just before updating is written is selected, and updated management information is written to a vacant page of thus selected block. Thus, management information just before updating can be protected from damage of all management information in a block due to a writing error raised when updating management information. So, even though a writing error is raised, management information can be updated using protected management information just before updating.

The invention claimed is:

1. An apparatus for recording data and management information, which writes data to a flash memory, the flash memory having data written therein in a unit of a page having data of a predetermined amount, which written data can be deleted at a time in a unit of a block composed of a plurality of pages, comprising:
   storage means for reading out management information stored in the flash memory to store read out management information;
   updating means for updating management information stored in the storage means;
   management information writing means for writing management information updated by the updating means to the page being a unit in writing data to the flash memory; and
   control means for controlling the management information writing means so that, when the management information writing means writes updated management information to a page of the flash memory, a block is selected which is different from a block including a page in which management information just before updating is written, and updated management information is written to a vacant page of the selected block,
   wherein a block is selected that is different from a block including a page in which management information just before updating is written at least in a case other than when a page in which management information just before updating is written is a last page of a block.

2. The apparatus for recording data and management information as set forth in claim 1, wherein, the block being a unit in deleting data written in the flash memory is composed of an even block and an odd block, and the control means controls the management information writing means so that, when the management information writing means writes updated management information to a page of the flash memory, the odd block is selected and updated management information is written to a vacant page of the selected odd block in case management information just before updating is written to the even block, while the even block is selected and updated management information is written to a vacant page of the selected even block in case management information just before updating is written to the odd block.

3. A method for writing management information to a flash memory, the flash memory having data written therein in a unit of a page having data of a predetermined amount, which written data can be deleted at a time in a unit of a block composed of a plurality of pages, comprising the steps of:
   reading out management information stored in the flash memory;
   having read out management information stored to a predetermined storage means;
   updating management information stored in the storage means;
   when writing updated management information to a page of the flash memory, selecting a block which is different from a block including a page in which management information just before updating is written;
   and writing updated management information to a vacant page of the selected block,
   whereby a block is selected that is different from a block including a page in which management information just before updating is written at least in a case other than when a page in which management information just before updating is written is a last page of a block.

4. The method for writing management information to a flash memory as set forth in claim 3, wherein, the block being a unit in deleting data written in the flash memory is composed of an even block and an odd block, and when writing updated management information to a page of the flash memory, selecting the odd block in case management information just before updating is written to the even block, writing updated management information to a vacant page of the selected odd block, selecting the even block in case management information just before updating is written to the odd block, writing updated management information to a vacant page of the selected even block.

5. In a device for reading and writing data and management information in a flash memory, the flash memory having data written therein in a unit of a page having data of a predetermined amount, which written data can be deleted at a time in a unit of a block composed of a plurality of pages, the flash memory including at least one page with management information stored therein, a method for controlling writing of management information to the flash memory for protecting the stored management information, comprising:
   reading previously stored management information from a page in a block of the flash memory;
   creating updated management information from the previously stored management information; and
   controlling writing of the updated management information to a block of the flash memory such that the updated management information is written to a block distinct from the block with the previously stored management information;
   wherein the updated management information is written to a block distinct from the block with the previously stored management information at least in a case other than when the previously stored management information is in a last page of a block, and
   whereby the stored management information is protected in the event of an error in writing the updated management information.

6. The method of claim 5, wherein the flash memory is composed of even blocks and odd blocks, and the controlling step includes:
   selecting an odd block if the stored management information is in an even block, and writing the updated management information to a vacant page of the selected odd block; and
   selecting an even block if the stored management information is in an odd block, and writing the updated management information to a vacant page of the selected even block.

7. A device for reading and writing data and management information in a flash memory, the flash memory having data written therein in a unit of a page having data of a predetermined amount, which written data can be deleted at a time in a unit of a block composed of a plurality of pages, the flash memory including at least one page with management information stored therein, the device for controlling writing of management information to the flash memory for protecting the stored management information, comprising:

a reading control circuit configured to read old management information from a page in a block of the flash memory;

an updating control circuit configured to create new management information from the old management information; and a writing control circuit configured to write the new management information to a block of the flash memory such that the new management information is written to a block distinct from the block with the old management information;

wherein the new management information is written to a distinct block of the flash memory at least in a case other than when the old management information is in a last page of a block of the flash memory, and whereby the old management information is protected in the event of an error in writing the new management information.

8. The device of claim 7, wherein the flash memory is composed of even blocks and odd blocks, and the writing control circuit is further configured:

(a) to control selection of an odd block if the old management information is in an even block, and to control writing the new management information to a vacant page of the selected odd block; and (b) to control selection of an even block if the old management information is in an odd block, and to control writing the new management information to a vacant page of the selected even block.

9. An apparatus for reading and writing management information in a flash memory, the flash memory having data written therein in a unit of a page having data of a predetermined amount, which written data can be deleted at a time in a unit of a block composed of a plurality of pages, the flash memory including at least one page with management information stored therein, the apparatus for controlling writing of management information to the flash memory for protecting the stored management information, comprising:

a processor configured with processor control instructions that control reading previously stored management information from a page in a block of the flash memory;

the processor being further configured with processor control instructions that control creating updated management information from the previously stored management information; and the processor being further configured with processor control instructions that control writing the updated management information to a block of the flash memory such that the updated management information is written to a block distinct from the block with the previously stored management information;

wherein the updated management information is written to a distinct block of the flash memory at least in a case other than when the previously stored management information is in a last page of a block of the flash memory, whereby the processor protects the stored management information in the event of an error in writing the updated management information.

10. The apparatus of claim 9, wherein the flash memory is composed of even blocks and odd blocks, and the processor control instructions that control writing the updated management information are further configured (a) to control selection of an odd block if the previously stored management information is in an even block and to control selection of an even block if the previously stored management information is in an odd block; and (b) to control writing the updated management information to a vacant page of the selected block.

* * * * *

UNITED STATES PATENT AND TRADEMARK OFFICE
CERTIFICATE OF CORRECTION

PATENT NO.         : 7,065,608 B2                                           Page 1 of 1
APPLICATION NO.    : 10/204776
DATED              : June 20, 2006
INVENTOR(S)        : Kenichi Nakanishi It is certified that error appears in the above-identified patent and that said Letters Patent is hereby corrected as shown below:

Column 6, line 67, "ba" should read -- 10a --.
Column 7, line 15, "lob" should read -- 10b --.
Column 7, line 22, "lob" should read -- 10b --.

Signed and Sealed this

Twenty-first Day of November, 2006

JON W. DUDAS
*Director of the United States Patent and Trademark Office*